US006324907B1

(12) United States Patent
Halteren et al.

(10) Patent No.: US 6,324,907 B1
(45) Date of Patent: Dec. 4, 2001

(54) FLEXIBLE SUBSTRATE TRANSDUCER ASSEMBLY

(75) Inventors: Aart van Halteren, Hobrede (NL); Poul Rosenkilde Kristensen, Farum (DK)

(73) Assignee: Microtronic A/S, Roskilde (DK)

( * ) Notice: Subject to any disclaimer, the term of this patent is extended or adjusted under 35 U.S.C. 154(b) by 0 days.

(21) Appl. No.: 09/450,994

(22) Filed: Nov. 29, 1999

(51) Int. Cl.[7] .......................... G01D 11/24; H04R 25/00; H01L 41/08

(52) U.S. Cl. .......................... 73/431; 381/189; 310/334

(58) Field of Search .......................... 73/431, 703, 719, 73/720, 725, 726, 727; 381/189, 190, 191, 355; 310/327, 334

(56) References Cited

U.S. PATENT DOCUMENTS 4,316,115 * 2/1982 Wilson et al. ...................... 310/327
5,059,851 * 10/1991 Corl et al. ...................... 310/334
5,131,399 7/1992 Sciarra ...................... 128/671
5,184,107 * 2/1993 Maurer ...................... 73/721
5,740,261 4/1998 Loeppert et al. ...................... 381/168
6,153,070 * 11/2000 Maurer et al. ...................... 204/416

FOREIGN PATENT DOCUMENTS 0671221 9/1995 (EP) .

* cited by examiner

*Primary Examiner*—Helen Kwok

(57) ABSTRACT

A flexible substrate transducer assembly integrates a transducer or transducer system with built-in signal processing capability, and a flexible substrate. The flexible substrate provides connectivity between the transducer system and electronic equipment which house the transducer assembly. This assembly is adapted for use in compact equipment such as mobile phones and hearing instruments that benefit from the small outer dimensions achievable for the assembly.

26 Claims, 5 Drawing Sheets

TOP VIEW

FLEXIBLE SUBSTRATE TRANSDUCER ASSEMBLY

FIELD OF THE INVENTION

The present invention relates to a flexible substrate transducer assembly that integrates a transducer or a transducer system, such as a gas sensor or electro-acoustic transducer, with or without built-in signal processing capability, and a flexible substrate. The flexible substrate is used to provide connectivity between the transducer system and electronic equipment which house the transducer assembly. This integration of the transducer system and a flexible carrier substrate provides an integrated solution that supports cost-effective manufacturing of the flexible substrate transducer assembly by using standard components and proven manufacturing technologies. The present invention is particularly well adapted for use in compact electronic equipment such as mobile phones and hearing instruments that will benefit from the small outer dimensions obtainable by the present flexible substrate transducer assembly.

BACKGROUND OF THE INVENTION

Electronic equipment that utilises one or several transducers such as hearing instruments, mobile phones, medical dispensing devices etc. require that a number of electrical connections is established between signal and power terminals of the transducers and a printed circuit board housed within the electronic equipment and providing corresponding electrical contact pads or terminals. These electrical connections may be adapted to provide DC voltages and currents, digital control or data signals, digital or analogue transducer signals etc. between the printed circuit board and the transducers.

In mobile phones and hearing instrument applications, flexible transducer assemblies will typically comprise microphone(s), loudspeaker(s) or receiver(s), telecoils and, often, associated amplification circuitry which typically are required for audio signal reception/transmission and amplification.

Depending on the type of transducer assembly, it may require that two, three or even more terminals are electrically connected to the printed circuit board. These connections have previously often been provided by means of flexible leads, such as well known litz wires. However, the use of such flexible leads makes the electronic equipment unsuited for automated machine assembly. Consequently, human operators are required to carry out the process of soldering and correctly connecting the leads between corresponding terminal pairs of the transducer assemblies and the printed circuit board.

A fully silicon based sensor assembly or sensor system, which may comprise a transducer or transducer system, has recently been disclosed in assignee's pending application U.S Ser. No. 09/391,628. This sensor assembly may comprise three separate silicon substrates, that function as a transducer, an electronic signal processing circuit and a connectivity layer, respectively, assembled into a single silicon based transducer system. Even though such a silicon based transducer or sensor assembly has a number of desirable properties such as small volume, high reliability etc. it would be desirable to provide a transducer assembly that is better suited for manufacture in existing standard production equipment and processes, such as pick and place machines and re-flow soldering.

The flexible substrate transducer assembly or transducer assembly according to the present invention provides the desired ease of manufacture and may, furthermore, convey the transducer signals through a number of EMI shielded flexprint conductors and terminals or pads, thus making it possible to completely dispense with the common flexible connection leads.

U.S. Pat. No. 5,740,261 discloses a silicon based microphone having its connection terminals abutted against corresponding terminals of a flexible circuit. The silicon microphone is shielded against physical damage by a jacket that has a cylindrical top and bottom cup forming a housing that surrounds the silicon microphone. A hole in a top portion of the jacket provides an acoustic port that allows external sound pressure to enter the internal of the jacket and contact one side of a membrane of the silicon microphone. The disclosed transducer assembly is, however, not particularly well-suited for automated manufacturing. In particular, the jacket comprises a large number of relatively complex miniature mechanical parts that may require a time-consuming and manual assembly procedure.

Consequently, none of these transducer/sensor assemblies are fully satisfactory for applications in miniature or compact electronic equipment that require fabrication of large numbers of low-cost devices.

SUMMARY OF THE INVENTION

It is an object of the invention to provide a flexible substrate transducer assembly suitable of integration within compact electronic equipment, such as a hearing instruments, mobile phones, a medical dispensing devices etc.

It is also an object of the invention to provide a flexible substrate transducer assembly suitable for manufacture by application of existing standard production equipment and processes to provide a low cost device.

A first aspect of the invention relates to a flexible substrate transducer assembly, comprising:

a flexible elongate member having an upper and a lower surface and comprising at least two conductors that each has an exposed part at a first end of the member and a contact pad at a second end of the member, a transducer system adapted to generate or receive a transducer signal on two or more signal terminals and to convey the transducer signal from the two or more signal terminals to the respective contact pads, the transducer system being attached to the upper surface at the second end of the flexible elongate member, a lid attached to the upper surface of the flexible elongate member and covering and shielding the transducer system and a supporting area of the flexible elongate member from an external environment, wherein the supporting area of the flexible elongate member comprises one or several holes extending through the flexible elongate member so as to provide a first passage to the external environment between the lower surface of the member and the transducer system covered by the lid.

In the present specification, the term "lid" designates various forms of covers, casings and housings that are capable of providing the shielding from the external environment. In some embodiments of the invention, the lid provides a substantially airtight acoustical seal to the external environment, while in other embodiments of the invention, a predetermined passage through the lid to the transducer system may be provided. In the last situation, a screen covering the predetermined passage may be utilised to prevent contamination from the external environment to enter inside of the chamber covered by the lid.

A number of electrical signals may be provided on respective electrical conductors, which is comprised within or disposed on the flexible elongate member or flexible member that may be a flexible foil strip or a strip of flexible printed circuit board. If the conductors are disposed on the upper or the lower surface of the member, they are preferably covered by an insulating layer, which protects the conductors from corrosion and physical damage. In order to provide an electrical connection pad to each of the conductors, an exposed part may be provided by forming an aperture in the insulating layer or mask of each conductor at the first end of the member. By forming a number of apertures, a number of exposed parts acting as connection pads or terminals is provided on the member. These connection pads are typically formed only on one side of the member while conductors that may be arranged on the reverse surface may be rendered completely covered by the insulating layer.

The supporting area of the flexible elongate member is bounded by the lid attached to the member's upper surface. The lid is, preferably, a closed lid without openings to the external environment so that when the lid is mounted over the transducer system and attached to the upper surface of the flexible member, the supporting area and the transducer system are shielded by the combined arrangement of the lid and the flexible member. The transducer system is allowed to interact with the external environment through the one or several holes positioned within the supporting area and which extend through the flexible member. Consequently, the flexible member forms part of an encapsulation of the transducer system. On one hand, the flexible member is utilised to shield the transducer system from the external environment and on the other hand, the flexible member is used to convey electrical signals generated by the transducer system to the exposed parts located at the first end of the member. The exposed parts being connectable to corresponding terminals of the piece of electronic equipment employing the flexible substrate transducer assembly. If the transducer system comprises a microphone or a miniature loudspeaker (receiver, in hearing instrument terminology), the one or several holes in the flexible elongate member function as sound pressure inlet or outlet port(s) so that sound pressure is conveyed between the external environment and the transducer system. The dimensions of the individual holes of the one or several holes of the flexible elongate member may be designed to provide a predetermined acoustic impedance so as to obtain a target frequency response of the transducer system.

The lid preferably comprises, or is fully fabricated in, an electrically and/or magnetically conductive material. This will make the lid function as an EMI shield that effectively shields the transducer system and the generated transducer signals from interfering electromagnetic signals of the external environment. Often these interfering electromagnetic signals are generated by mobile phones such as GSM phones or DECT phones and constitute a serious problems for hearing instrument users, since loud and highly annoying noise signals often are generated in the hearing instruments in response to e.g. GSM signals. Pick-up and subsequent demodulation of these GSM signals often take place in a signal processing circuit included in a transducer housing. A similar noise pick-up problem also exists in mobile phones wherein the interfering signal can be fed back to an audio/speech path of the phone and contaminate the audio signal with the interfering noise so that a noisy resulting audio signal is transmitted from a phone caller to a receiving party.

The lid may be fabricated in a metal by the use of a moulding process, a cold stamping process or a deep draw process. These fabrication processes are already well-known standard processes and allow the lid to be fabricated in a convenient and cost-effective manner by utilising existing production equipment.

The lid may comprise, or be fully manufactured in, if the above-mentioned fabrication processes are utilised, various materials such as copper, iron, steel, silver, gold, tin, aluminium, nickel. Alternatively, the lid may be fabricated in a non-corrosive alloy, such as stainless steel, Covar®, Invar®, Paliney etc. so as to better withstand moisture and other contamination in the external environment surrounding the flexible substrate transducer assembly. Finally, electrical conductive polymer could also be used as a lid material.

According to a preferred embodiment of the invention, the lid is electrically conductive and connected to at least one of the at least two conductors of the flexible elongate member. The lid may accordingly be electrically connected to a ground conductor, and the exposed part of this ground conductor is preferably electrically connected to a ground terminal of the electronic equipment housing the flexible substrate transducer assembly. Consequently, the interfering electromagnetic signals are at least partly absorbed by the lid and shorted to ground, thereby minimising the coupling of noise-inducing interfering signals to the output signals of the transducer system. The electrical connection between the lid and the at least one conductor may be provided by applying conductive glue or conductive epoxy to that edge of the lid that is attached to the member and arranging an exposed area of the ground conductor below a part of the intended position of the edge of the lid. Alternatively, the ground conductor may be positioned in an intermediate layer of the member, i.e. between the upper and lower surfaces so that directly accessing an exposed area of the ground conductor to provide the required electrical connection to the lid is prevented. In this situation, the required electrical connection may be provided by forming one or several apertures below the intended contact edge of the lid and extending through an upper layer of the member so as to expose the intermediate ground conductor layer which can be contacted by e.g. electrical conductive glue filling out the one or several apertures. The embodiment utilising such an electrically conductive intermediate layer may provide the flexible substrate transducer assembly with satisfactory EMI shielding characteristics. Even better EMI shielding may be obtained by providing the upper and/or lower surface of the flexible member as ground planes, and arrange the transducer signal(s) and the power supply on respective conductors that are placed in the intermediate layer. The inherent capacitance between the upper and/or lower surface and the conductors in the intermediate layer may serve as RF-decoupling. Furthermore, miniature inductors could be formed on the transducer signal and power supply conductors, e.g. close to the contact pads, within the intermediate layer, so as providing the complete flexible member with predetermined RF-attenuation characteristics to cancel pick-up of e.g. GSM signals.

The required electrical connection between the electrically conductive lid and the ground conductor may also be provided by a rolling process or a welding process. The shape of the member and the mutual placement of the ground conductor and the member must naturally be appropriately adapted to support such processes.

According to a preferred embodiment of the invention, the flexible elongate member comprises a flexible circuit strip. The flexible circuit strip may comprise a 40–100 $\mu$m thick upper kapton® layer, a glue layer of about 25 $\mu$m thickness, a copper layer of about 10–20 $\mu$m thickness that holds three conductors, another glue layer of about 12 $\mu$m thickness and finally a 10–20 $\mu$m thick lower kapton® layer.

Accordingly, the conductors are provided in single layer and they may be exposed at the first end of the member by making the lower kapton® layer shorter than the upper kapton® layer.

The transducer system may comprise a single or several individual silicon dies or substrates. According to a preferred embodiment of the invention, the transducer system comprises a first die and a second die, preferably both of silicon. The first die comprises a transducer, such as an acoustic sound pressure transducer, which is adapted to generate the transducer signal on the two or more signal terminals in response to a measured physical quantity such as a sound pressure. The second substrate comprises an electronic circuit adapted to receive and process the transducer signal and convey a processed transducer signal to the contact pads arranged at the second end of the flexible member. The electronic circuit may be constituted by proprietary Application Specific Integrated Circuit (ASIC) having characteristics specifically tailored to the characteristics of the associated transducer on the first die. Such an ASIC may, as an example, comprise a low-noise preamplifier/buffer and/or voltage supply circuit specifically tailored to interface to a miniature silicon microphone, or it may comprise a power amplifier driving an audio signal across a miniature loudspeaker. The electronic circuit may furthermore comprise a proprietary analogue-to-digital converter or digital-to-analogue converter, the latter optionally integrated with the power amplifier to provide a fully digital power amplifier. Alternatively, the electronic circuit may be constituted by a commercially available integrated circuit or semiconductor(s) implementing one or several of the above-mentioned signal processing functions.

The acoustic sound pressure transducer comprised on the first die may comprise a miniature silicon microphone. Such a miniature silicon microphone may comprise a membrane and a back plate and the miniature silicon microphone may be positioned so that the membrane faces the one or several holes extending through the member. The membrane portion of the microphone may be positioned so as to completely cover the one or several holes which provide the first passage to the external environment. Consequently, a back side of the membrane faces a (back) chamber defined by the lid and this chamber is acoustically isolated from the front side of the membrane, at least within the target frequency range of the microphone (microphone membranes are typically provided with a tiny static pressure release hole). This arrangement provides an omnidirectional microphone. A major advantage of this embodiment of the invention is that the membrane faces the external environment, through the one or several holes in the member, thereby providing a sealing barrier that isolates the sensitive back plate and back side of the microphone from the external environment. Since the back side of the membrane is isolated from the front side, the back chamber of the microphone is formed by the joint encapsulation of the lid and the flexible member. The sound inlet port of the omni-directional microphone is formed by the one or several holes arranged in the supporting part of the flexible member.

According to another microphone embodiment of the invention, the lid may also comprise one or several holes at predetermined position(s) to provide a second passage between the external environment and the miniature silicon microphone. Consequently, the second passage provides an acoustical path to the back side of the membrane of the silicon microphone, thereby forming a directional microphone. An acoustical delay element may further be arranged in one of the passages to enhance the directional response of the microphone.

In some embodiments of the invention, the first die may comprise an actuator such as an acoustical transducer that generates, rather than responds to, an acoustical signal, i.e. a miniature loudspeaker or receiver. The acoustical transducer being excited by a processed transducer signal provided by the second substrate. In such embodiments, the actuator or transducer must, accordingly, be adapted to receive a processed transducer signal from the two or more signal terminals, and the electronic circuit comprised on the second substrate adapted to receive and process the transducer signal and convey the processed transducer signal to the two or more signal terminals of the first die. If the actuator is a sound pressure generator, the transducer signal could be an analogue or digitally encoded audio signal generated by the electronic equipment and provided to the contact pads through the respective conductors and exposed parts arranged on the flexible member. The electronic circuit may comprises a digital-to-analogue converter, preferably a digital-to-analogue converter based on Pulse Width Modulation or Pulse Density Modulation. In low power applications, such converter types are highly advantageous since they are capable of directly converting a PCM digital audio signal into a “power” analogue transducer signal with a very high power conversion efficiency.

An important issue that needs to be addressed in the present invention is the capability of the flexible substrate transducer assembly to withstand stress forces acting on the flexible member and the attached transducer system covered by the lid. Such stress force may be generated by differing thermal coefficients of expansion/compression between the material/materials of the member and the material of transducer system or between the material(s) of the lid and the member. According to a preferred embodiment of the invention this problem has been solved by attaching at least a part of the transducer system to the member through an intermediate resilient layer adapted to absorb stress forces between the member and the transducer system. This intermediate resilient layer may comprise a resilient glue joint or joints or it may comprise a resilient piece of foil, foam or rubber.

The flexible substrate transducer assembly may be subjected to other forces than thermally generated expansion/compression forces. Large externally generated forces caused by rough handling of a piece of electronic equipment that holds the transducer assembly is a common situation for mobile phone and hearing instrument applications, as well as other portable applications. If these external forces are sufficiently large, they may damage the transducer system or individual parts of the transducer system which often contains one or two substrates attached to the surface of the member and having wire-bonded connection leads to the contact pads arranged on the member. According to a preferred embodiment of the invention, these potentially damaging forces are minimised by substantially rigidly attaching the lid to the upper surface of the flexible elongate member to restrain the supporting area of the flexible elongate member so as to increase a stiffness of the supporting area. Such a substantially rigid connection between the lid and the member could be provided by a welding or soldering process or even by using an appropriate glue.

Many of the described embodiments of the flexible substrate transducer assembly can advantageously be employed in mobile or cellular phones, such as GSM or DECT phones.

However, many other types of compact electronic equipment may also benefit from the compactness of, and the automated assembly process supported by, the present flexible substrate transducer assembly.

BRIEF DESCRIPTION OF THE DRAWINGS

Hereunder, preferred embodiments of flexible substrate transducer assemblies according to the invention are described with reference to the drawings, wherein.

DETAILED DESCRIPTION OF A PREFERRED EMBODIMENT

Figure 1:
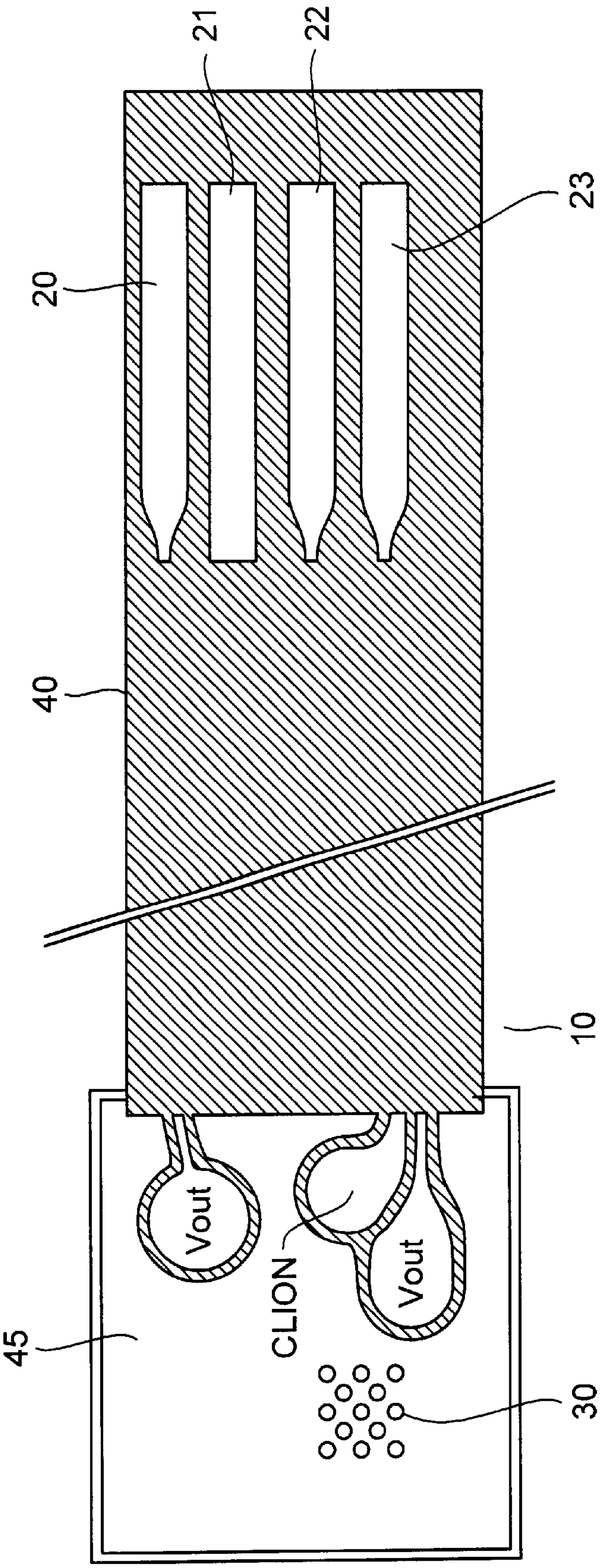
FIG. 1 illustrates a lower surface of a flexible substrate transducer assembly comprising a flexible circuit strip according to a first embodiment of the invention.
Figure 4:
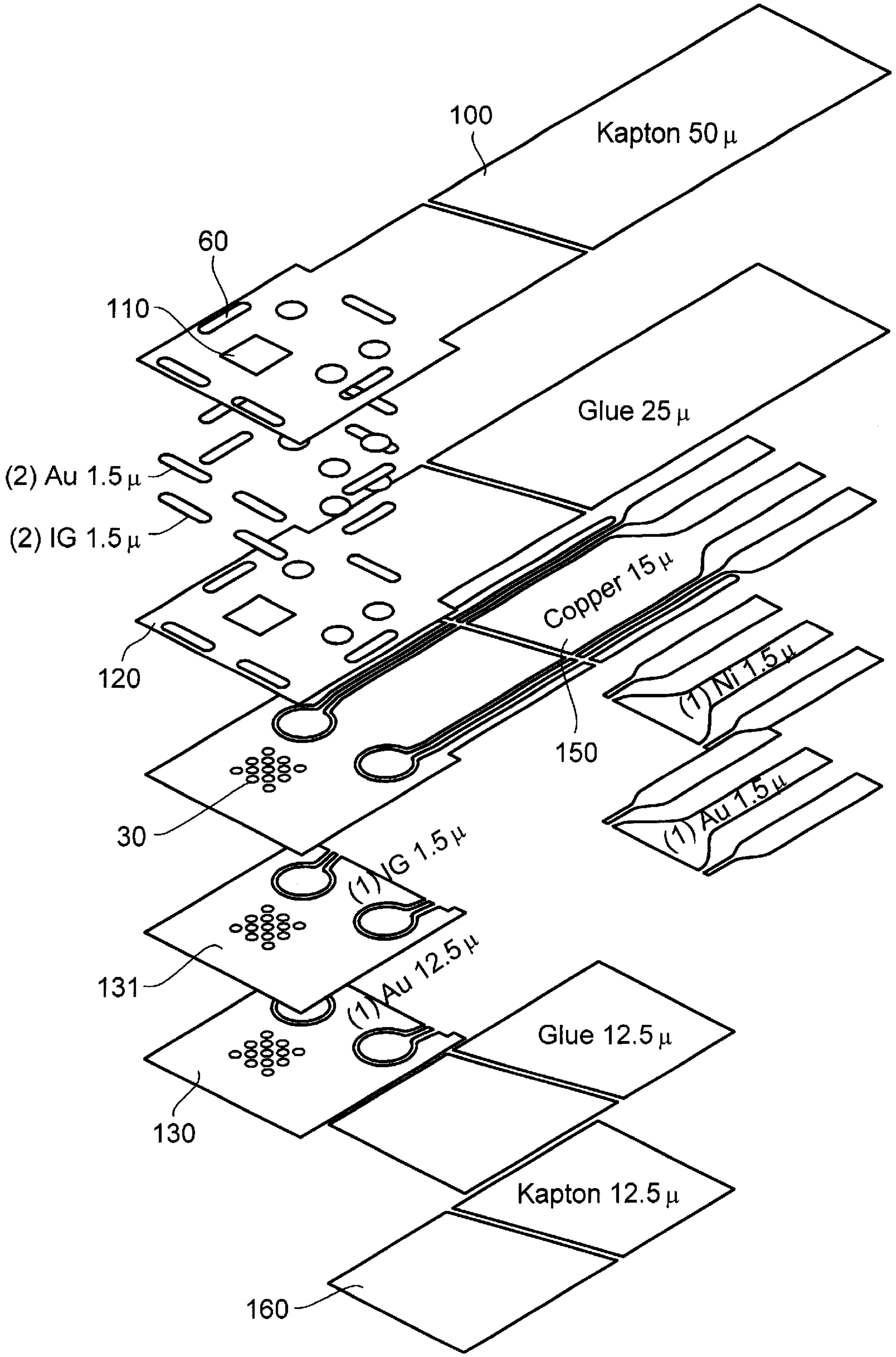
FIG. 4 is an exploded view of the flexible member of FIG. 3–3C and discloses various layers of the flexible member.

Four electrical conductors 20–23 are arranged on the lower surface of flexible member 40 of flexible substrate transducer assembly 10 of FIG. 1. Four exposed parts corresponding to the respective conductors 20–23 are arranged at a first end of the member. These exposed parts are utilized as contact pads that provide required electrical connections between assembly 10 and a piece of electronic equipment (not shown) that holds a connector adapted to contact and fix the position of the exposed parts. Conductor 21 is a ground terminal and therefore occupies most of an area of a conducting layer in the flexible member 40 (as item 150 of FIG. 4) to provide an EMI decoupling of conductors 20, 22, 23. The ground conductor 21 is furthermore arranged around a circumference of a second end portion 45 of the member 10, while each of the three other conductors 20, 22, 23 is terminated in a corresponding contact pad, Vout 50, CLKIN 51, Vbat 52 located at the second end of the member.

Figure 2A:
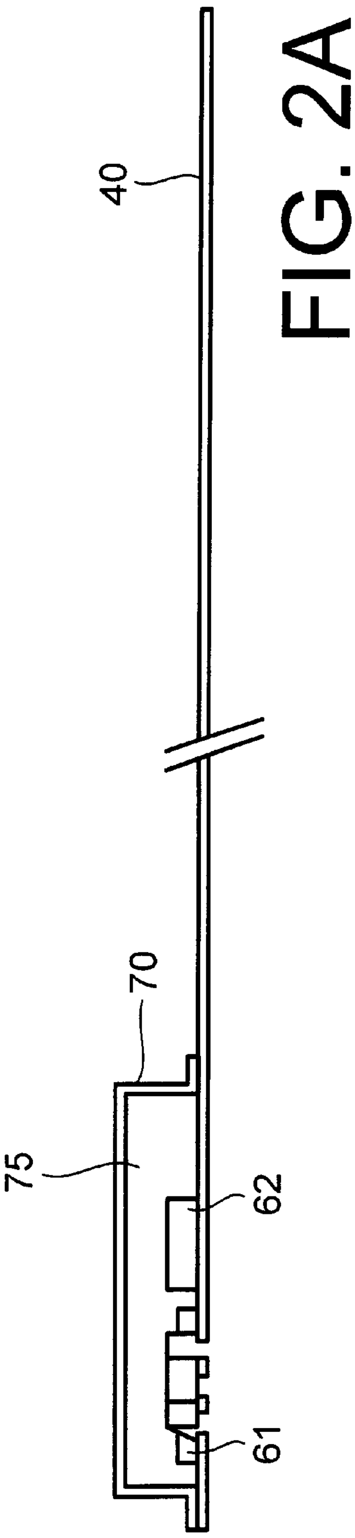
FIGS. 2A–2B illustrates an upper surface and an attached transducer system of the flexible substrate transducer assembly of FIG. 1.
Figure 2B:
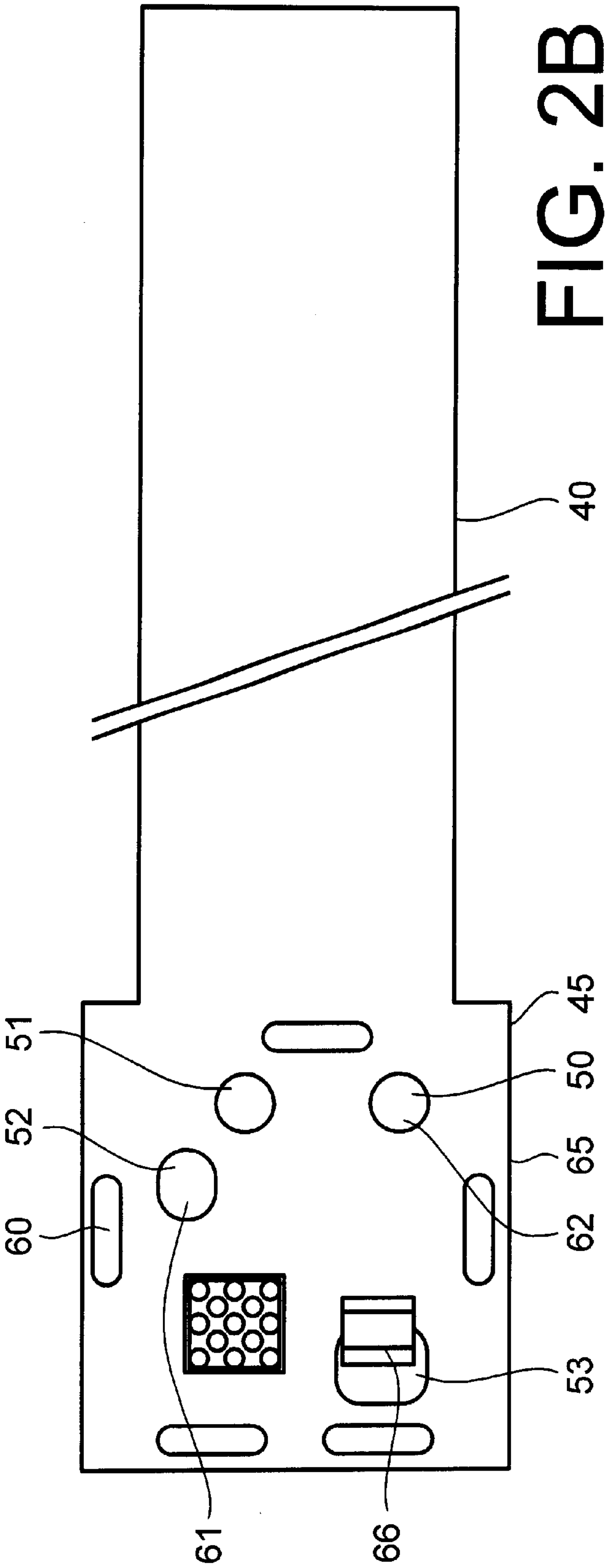

A transducer system covered by a lid is arranged on the reverse side of the second end portion 45 of the flexible member 40, as illustrated in FIGS. 2A–2B. A number of holes 30 extending through the second end portion 45 of the flexible member 10 are furthermore provided, thereby creating a first passage to the external environment between the lower surface of the flexible member 40 and the transducer system. As shown in FIGS. 2A–2B, the transducer system comprises a silicon microphone 61 and a signal processing electronic circuit constituted by an ASIC 62 that receives an output signal of the silicon microphone 61 on an input terminal through a direct wire bond between a substrate of the microphone and the ASIC. The ASIC 62 comprises an analogue-to-digital converter which generates a processed digital microphone output signal on at a contact pad, Vout 50. A second contact pad, CLKIN 51, provides an externally generated clock signal to the analogue-to-digital converter ASIC 62 and contact pads Vbat 52 and Gnd 53 provide a voltage supply and ground connection, respectively, to the silicon microphone 61 and the ASIC 62. A conventional SMD-type power supply capacitor 66 is also included in the present transducer system and used for power supply de-coupling purposes.

A number of apertures 60 is provided along the outer circumference of the second end portion 45 of the flexible member 40. These apertures provide an electrically conducting path from a metal lid 70 to the conducting layer (as item 150 of FIG. 4) that functions as a ground conductor in the present embodiment of the invention. When the flexible substrate transducer assembly 10 is fully assembled, the lid 70 is attached to the end portion 45 and covers the transducer system so that the circumference of the lid 70 is positioned along broken line 65. As illustrated on an upper cross-sectional view in FIGS. 2A–2B, the lid 70 covers the transducer system and shields it from the external environment. The silicon microphone 61 is arranged with front side of its membrane facing the holes and its backside facing a cavity 75 formed by the lid 70 and the flexible member 40, as illustrated in the cross-sectional view. Accordingly, an omni-directional microphone with a digital output signal is formed and integrated with the flexible member 40.

The total length of the flexible member 40 is, preferably, within range from 15 to 100 mm, more preferably from 15–30 mm or about 20 mm. The width is preferably selected within the range from 2–10 mm, more preferably from 3–6 mm or about 3.5 mm. The tickness is preferably selected within the range from 80–200 μm, more preferably from 100–150 μm such as about 120 μm. The illustrated nearly quadratic second end portion 45 of the member 10 has width and length dimensions of about 3–6 mm such as about 4.5 mm.

Figure 3:
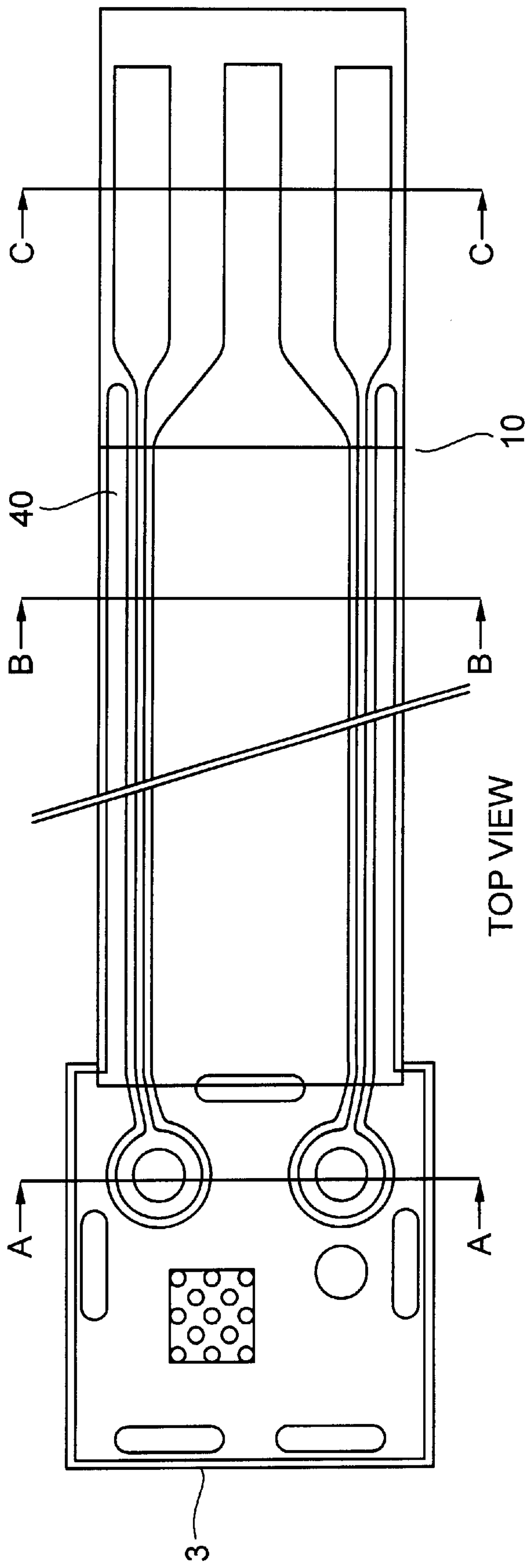
FIGS. 3–3C illustrates a lower surface of a flexible substrate transducer assembly in a slightly alternative embodiment of the invention and further illustrates three cross-sectional views of the flexible member, the flexible member comprising three conductors.
Figure 3A:
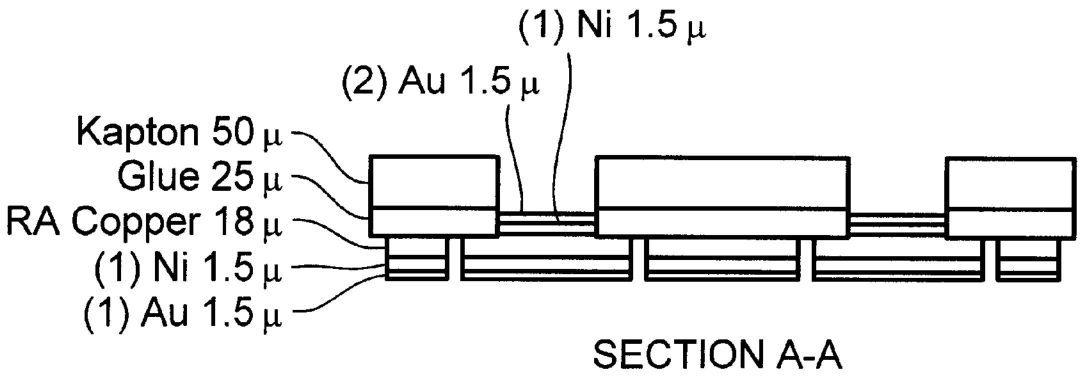
Figure 3B:
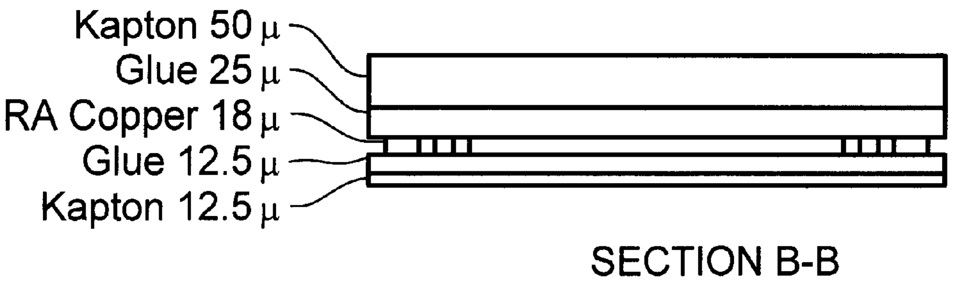
Figure 3C:
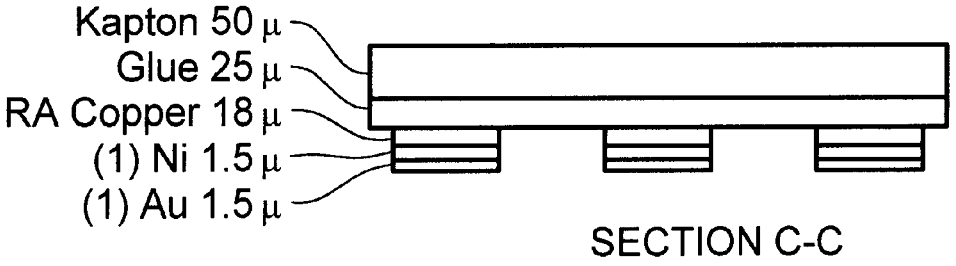

FIG. 3C shows the upper surface of a slightly modified embodiment, comprising three conductors, of the flexible substrate transducer assembly 10 shown in FIGS. 1 and 2A–2B. Three cross-section views, 3A, 3B and 3C of the member 40 along indicated lines A-A, B-B and C-C are also illustrated. The flexible member 40 comprises an upper kapton®layer, a glue layer, a (conductive) copper layer, another glue layer and finally a lower kapton®layer of reduced thickness compared to the upper kapton®layer. As shown in FIG. 3C, the first end of the flexible member is left without the lower kapton®layer and three exposed parts are formed in the conductive copper layer so as to provide electrical contact terminals for conveying transducer signals and power supply voltages between the flexible substrate transducer assembly 10 and the housing of the piece of electronic equipment holding the assembly 10.

What is claimed is:

1. A flexible substrate transducer assembly, comprising:

a flexible elongate member having an upper and a lower surface and comprising at least two conductors that each has an exposed part at a first end of the member and a contact pad at a second end of the member, a transducer system adapted to generate or receive a transducer signal on two or more signal terminals and to convey the transducer signal from the two or more signal terminals to the respective contact pads, the transducer system being attached to the upper surface at the second end of the flexible elongate member, a lid attached to the upper surface of the flexible elongate member and covering and shielding the transducer system and a supporting area of the flexible elongate member from an external environment, wherein the supporting area of the flexible elongate member comprises one or several holes extending through the flexible elongate member so as to provide a first passage to the external environment between the lower surface of the member and the transducer system covered by the lid.

2. A flexible substrate transducer assembly according to claim 1, wherein the lid comprises an electrically and/or magnetically conductive material.

3. A flexible substrate transducer assembly according to claim 2, wherein the lid is fabricated in a moulding process or in a cold stamping process or in a deep draw process.

4. A flexible substrate transducer assembly according to claim 1, wherein the lid comprises a material selected from the group consisting of copper, iron, steel, silver, gold, tin, and aluminum.

5. A flexible substrate transducer assembly according to claim 1, wherein the lid is fabricated from a non-corrosive alloy.

6. A flexible substrate transducer assembly according to claim 1, wherein the lid is electrically conductive and connected to at least one of the at least two conductors of the flexible elongate member.

7. A flexible substrate transducer assembly according to claim 6, wherein the electrical connection between the electrically conductive lid and the at least one of the at least two conductors is provided by an electrically conductive glue.

8. A flexible substrate transducer assembly according to claim 6, wherein the electrical connection between the electrically conductive lid and the at least one of the at least two conductors is provided by a rolling or a welding process.

9. A flexible substrate transducer assembly according to claim 1, wherein the flexible elongate member comprises a flexible circuit strip.

10. A flexible substrate transducer assembly according to claim 1, wherein the at least two conductors comprised on the flexible elongate member are arranged on a single surface of the upper and lower surfaces of the flexible elongate member.

11. A flexible substrate transducer assembly according to claim 1, wherein the flexible elongate member comprises an electrically conductive intermediate layer arranged between the upper surface and the lower surface to provide EMC shielding of the at least two conductors.

12. A flexible substrate transducer assembly according to claim 1, wherein the transducer system comprises a first die and second die.

13. A flexible substrate transducer assembly according to claim 12, wherein the first die comprises a transducer adapted to generate the transducer signal on the two or more signal terminals in response to a measured physical quantity, and the second die comprises an electronic circuit adapted to receive and process the transducer signal and convey a processed transducer signal to the contact pads.

14. A flexible substrate transducer assembly according to claim 13, wherein the electronic circuit comprises an analogue-to-digital converter.

15. A flexible substrate transducer assembly according to claim 12, wherein the transducer system comprises an acoustic sound pressure transducer.

16. A flexible substrate transducer assembly according to claim 15, wherein the acoustic sound pressure transducer comprises a miniature silicon microphone.

17. A flexible substrate transducer assembly according to claim 16, wherein the lid comprises one or several holes providing a second passage for the external environment to the miniature silicon microphone, thereby forming a directional microphone by a joint acoustic effect of the first passage in the flexible elongate member and the second passage in the lid.

18. A flexible substrate transducer assembly according to claim 16, wherein the miniature silicon microphone comprises a membrane and a back plate, the membrane facing one or several holes extending through the member, thereby providing a microphone wherein the lid functions as a back chamber and wherein a sound inlet port is formed in the supporting area of the flexible elongate member.

19. A flexible substrate transducer assembly according to claim 12, wherein the first die comprises a actuator adapted to receive a processed transducer signal from the two or more signal terminals, and the second die comprises an electronic circuit adapted to receive and process the transducer signal and convey the processed transducer signal to the two or more signal terminals.

20. A flexible substrate transducer assembly according to claim 19, wherein the actuator comprises a miniature sound pressure generator responding to the processed transducer signal.

21. A flexible substrate transducer assembly according to claim 19, wherein the electronic circuit comprises a digital-to-analogue converter.

22. A flexible substrate transducer assembly according to claim 1, wherein the lid is substantially rigidly attached to the upper surface of the flexible elongate member to restrain the supporting area of the flexible elongate member so as to increase a stiffness of the supporting area.

23. A flexible substrate transducer assembly according to claim 1, wherein at least a part of the transducer system is attached through an intermediate resilient layer adapted to absorb stress forces between the flexible elongate member and the transducer system generated by a differing thermal coefficient of expansion/compression between the flexible elongate member and the transducer system or generated by external forces.

24. A flexible substrate transducer assembly according to claim 23, wherein the intermediate resilient layer comprises a resilient glue joint or joints.

25. A flexible substrate transducer assembly according to claim 23, wherein the intermediate resilient layer comprises a resilient piece of foil, foam or rubber.

26. A mobile phone comprising the flexible substrate transducer assembly according to claim 1.

* * * * *